US006894933B2

(12) United States Patent
Kuzmenka et al.

(10) Patent No.: US 6,894,933 B2
(45) Date of Patent: May 17, 2005

(54) BUFFER AMPLIFIER ARCHITECTURE FOR SEMICONDUCTOR MEMORY CIRCUITS

(75) Inventors: Maksim Kuzmenka, Munich (DE); Oliver Kiehl, Charlotte, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/759,103

(22) Filed: Jan. 20, 2004

(65) Prior Publication Data

US 2004/0202027 A1 Oct. 14, 2004

(30) Foreign Application Priority Data

Jan. 21, 2003 (DE) .......................................... 103 02 128

(51) Int. Cl.[7] .............................................. G11C 7/00
(52) U.S. Cl. .................................. 365/189.05; 365/194
(58) Field of Search ........................... 365/189.05, 194, 365/63; 257/270, 161

(56) References Cited

U.S. PATENT DOCUMENTS 6,313,674 B1    11/2001  Akita et al.
6,396,768 B2     5/2002  Ooishi
6,441,665 B1 *   8/2002  Hashidate et al. .......... 327/270
6,598,171 B1 *   7/2003  Farmwald et al. .......... 713/401

* cited by examiner

Primary Examiner—Son T. Dinh
(74) Attorney, Agent, or Firm—Slater & Matsil, L.L.P.

(57) ABSTRACT

A buffer amplifier architecture for buffering signals which are supplied in parallel to identical chips, particularly DRAM chips, on a semiconductor memory module, is disclosed. The architecture has adjustable delay circuits in each signal line and a delay detector circuit which receives a clock signal from the buffer amplifier architecture at the input and at the output of the buffer amplifier architecture, and takes the phase difference between the two signals to produce a control signal for setting the variable delay time of the delay circuits. To ensure that the delay time set by the delay detector circuit is independent of variations in parameters of the DRAM memory chips, the feedback path routed to the input of the delay detector circuit has a reference line network of the same structure and having the same electrical properties as capacitance elements which terminate the line network routed to the DRAM memory chips and the reference line network, and which have the same capacitances as the signal inputs on the DRAM memory chips.

15 Claims, 3 Drawing Sheets

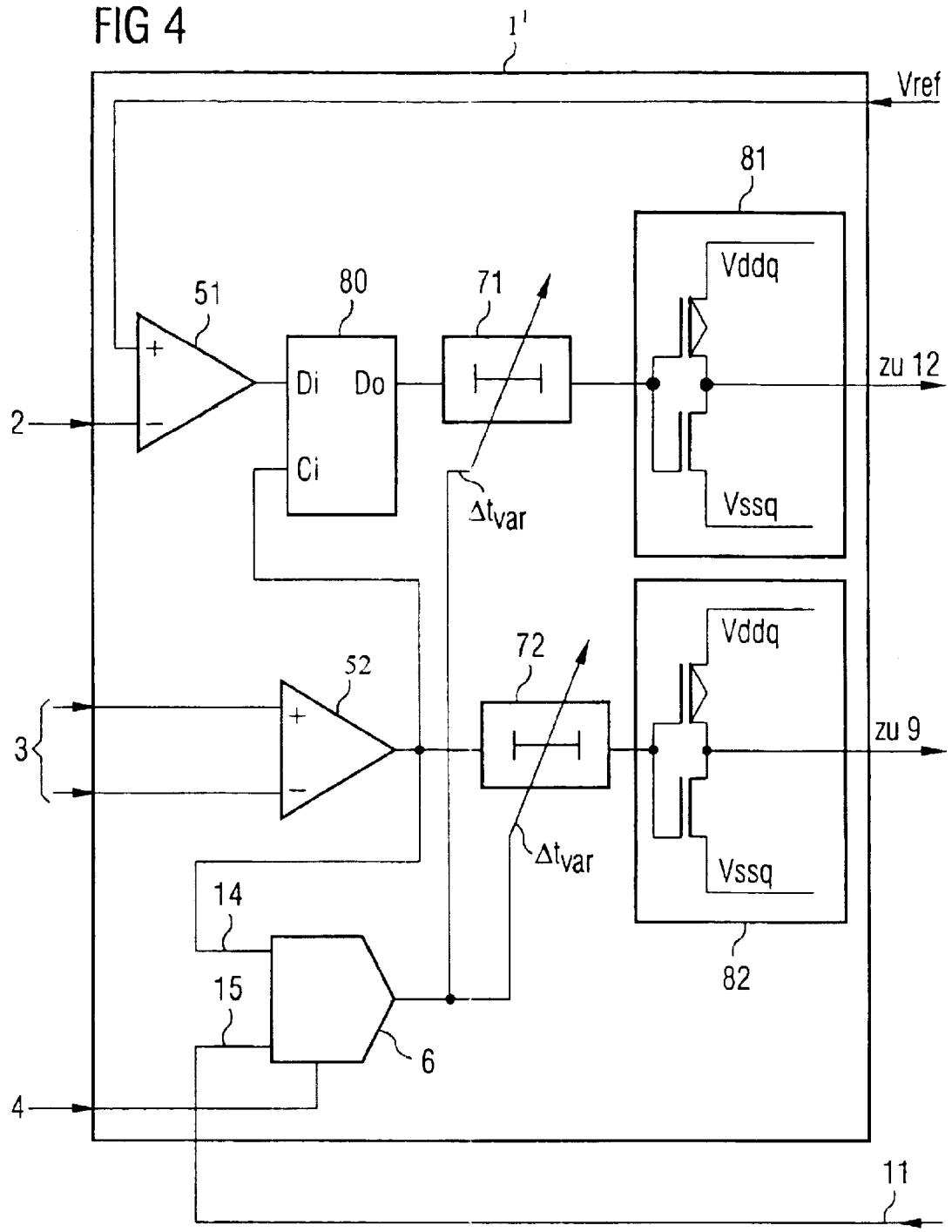

BUFFER AMPLIFIER ARCHITECTURE FOR SEMICONDUCTOR MEMORY CIRCUITS

BACKGROUND

1. Field of the Invention

The present invention relates to design of semiconductor memory circuits. More particularly, it relates to a buffer amplifier architecture for buffering signals that are supplied in parallel to identical chips on a semiconductor circuit module, particularly DRAM chips on a DRAM memory module.

2. Background Information

In semiconductor memory modules, for example DRAM memory modules, which are clocked at ever higher frequencies, it is paramount that signals supplied to a group of identical chips in parallel, such as address, command and data signals, should have the same signal propagation time to the extent possible. In this context, the delay time range of registers and buffer amplifier architectures that are used in conventional semiconductor memory modules provided with registers is frequently too high. The delay time typically ranges from 0.9 ns to 2.5 ns. As a result, at frequencies above 100 mHz, the time tolerances of the signals on the command/address bus are very narrow. Typically, this has been compensated for by a register delay using an adjustable clock delay. The setting of a clock delay, once made, is then fixed and does not adapt to different characteristics of the semiconductor circuit module. The inability to change the clock delay may be undesirable in certain applications.

SUMMARY

An exemplary embodiment of the present invention provides an architecture, applicable to buffer amplifiers and registers, that contains an adjustable delay and a fixed-delay feedback loop, which electrically encompasses the same path as the usual command and address lines. This reduces the difference between a minimum and a maximum delay from a buffer amplifier or register architecture to memory chips, and renders the delay independent of the parameters of the printed circuit board in the semiconductor circuit module.

In an exemplary embodiment of the present invention, a buffer amplifier architecture for buffering signals that are supplied in parallel to identical chips on a semiconductor circuit module includes a first set of receiver elements, designed for parallel reception of the signals, and a first set of output buffer amplifiers, each of which contains an input connected to an output of a respective receiver element in the first set of receiver elements. The first set of buffer amplifiers receives signals from the first set of receiver elements and produces buffered output signals that are supplied to chips on the semiconductor circuit module via a signal line network. The buffer amplifier architecture also includes a second set of receiver elements (also referred to as "system clock receiver elements"), designed for receiving a system clock signal, and a second set of output buffer amplifiers, each of whose input is connected to an output from a system clock receiver element, for the purpose of producing a buffered output clock signal.

In addition, a first set of delay circuits, each of which produce an adjustable delay time, is connected between the output of each of the first type of receiver elements and the input of each buffer amplifier in the first set of buffer amplifiers. The delay circuits provide a signal delay between output from a receiver element and input to an output buffer, according to a set delay time. A second set of delay circuits with an adjustable delay time is provided between the output of a clock signal receiver element and an input of a clock signal output buffer amplifier, for the purpose of delaying the clock signal between an output from the receiver element and an input at the buffer amplifier, in accordance with a set delay time.

Additionally, a delay detector circuit is provided that contains a first and a second input, where the first input is connected to the output of the clock cycle receiver element and the second input is connected via a feedback loop to an output of the clock signal output buffer amplifier. The delay detector circuit provides for the detection of an actual delay time between a clock signal applied to its first and second inputs. A third input to the delay detector circuit applies a reference signal indicating a nominal delay. The delay detector circuit also contains a differential amplifier, which is arranged to produce a control voltage that corresponds to the difference between the detected actual delay time and the nominal delay time indicated by the reference signal. The differential amplifier control voltage is supplied to a control input on the first delay circuit, and also supplied to a control unit on the clock signal delay circuit, for the purpose of setting the delay time.

The structure and operation of the buffer amplifier architecture which have been described above, thus reduce the difference between the minimum and the maximum delay from the buffer/register to a semiconductor chip and also render the delay independent of the parameters of the printed circuit board.

The foregoing and further advantageous features of the present invention are explained in more detail in the description below with reference to the drawings.

BRIEF DESCRIPTION OF THE DRAWINGS

FIG. 4 depicts a section of a register module according to another exemplary embodiment of the present invention.

DETAILED DESCRIPTION OF THE INVENTION

The following list of symbols is used consistently throughout the text and drawings.

Figure 1:
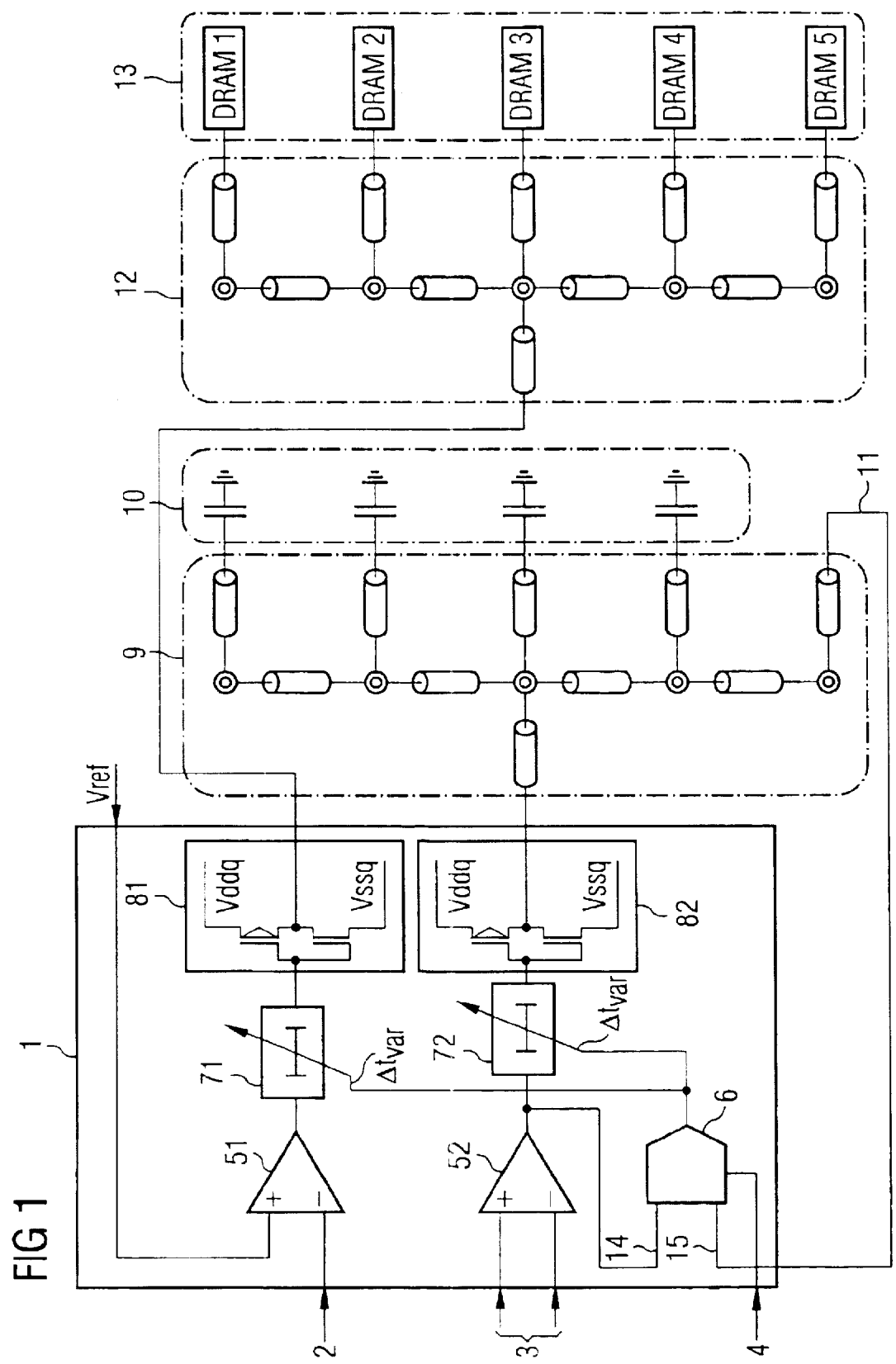
FIG. 1 illustrates a schematic of a buffer amplifier architecture according to an embodiment of the present invention.

1 Buffer amplifier architecture
2 Command-address signals
3 Clock signal
4 Reference signal
51, 52 First and second receiver elements
6 Delay detector circuit
71, 72 First, second delay circuits
81, 82 First, second output buffer amplifiers
9 Reference line network
10 Terminating capacitance elements
11 Feedback loop
12 Signal line network
13 DRAM memory chips
14, 15 First and second input for the delay detector circuit 6
16 Exclusive-OR gate 17 Resistor
18 Output of the exclusive-OR gate
20 Output of an integration circuit
21 Capacitor
22 Differential amplifier
23 Output of the differential amplifier 22
80 Register Referring to FIG. 1, a buffer amplifier architecture, denoted generally by 1, contains a first receiver element 51, in the form of a differential amplifier for receiving command and address signals 2 (FIG. 1 shows one channel only, while the actual number of signals 2 is in the range from 22 to 48). A second receiver element 52, implemented as a differential amplifier, receives differential clock signals 3. An output of first receiver element 51 is connected via first delay circuit 71, having an ajustable delay time $\Delta t_{var}$, to an input on first output buffer amplifier 81, which is in the form of a push-pull buffer amplifier.

In the same manner, the output of the second receiver element 52 is connected via a delay circuit 72, having an adjustable time delay $\Delta t_{var}$, to an input on a second output buffer amplifier 82, which, like the first output buffer amplifier 81, is in the form of a push-pull buffer amplifier.

The respective outputs of the first output buffer amplifiers 81 are connected via a line network 12 on a printed circuit board (not shown) to command and address inputs on a plurality of parallel DRAM chips DRAM1, DRAM2, ..., DRAM5.

The output of the second output buffer amplifier 82, which carries the clock signal delayed by the second delay circuit 72 with a variable delay, is connected via a reference line network 9 on the printed circuit board (not shown) to terminating capacitance elements 10, which have the same capacitance as the signal inputs of the memory chips 13. Capacitance elements 10 can either be dummy pins on the memory chips 13 or unused signal inputs on the same. This renders the system insensitive to variations in the parameters of the memory chips 13. It is important that the topology of signal line network 12 and of the reference line network 9 are the same in electrical terms. From reference line network 9, a feedback line 11 is routed to an input 15 on a delay detector circuit 6, whose architecture and operation is described below with reference to FIGS. 2 and 3.

Figure 2:
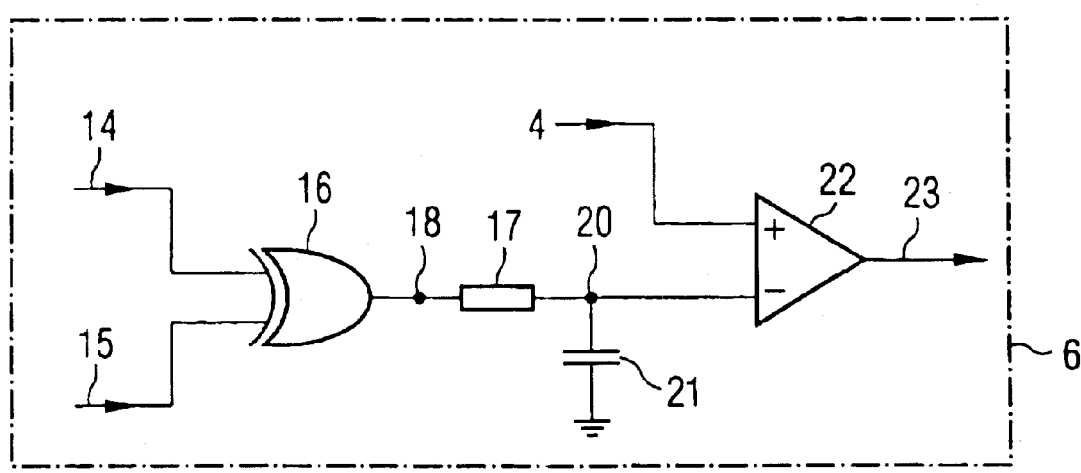
FIG. 2 depicts a circuit diagram of a preferred architecture of a delay detector circuit from FIG. 1, according to a preferred embodiment of the present invention.

FIG. 2 shows an exemplary embodiment of the present invention, which includes a circuit architecture for delay detector circuit 6. An input 14 on an exclusive-OR gate 16 receives a clock signal which is output from receiver element 52, while the other input 15 to delay detector circuit 6 is connected to feedback line 11 leading from reference line network 9.

Figure 3:
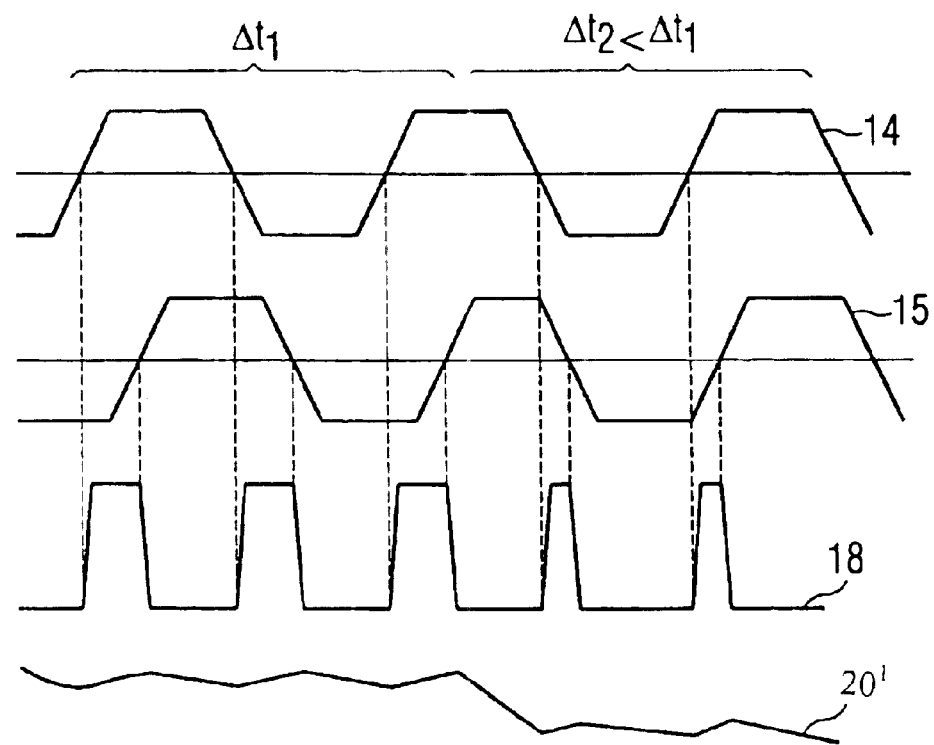
FIG. 3 is a signal timing diagram showing signals at various circuit points in the delay detector circuit shown in FIG. 2.

FIG. 3 shows examples of signal profiles for the two input signals 14 and 15 to exclusive-OR gate 16, as well as an output signal 18, for two different cases: 1) a long delay $\Delta t1$ (left hand side in FIG. 3) and 2) a shorter delay $\Delta t2$ (right hand side in FIG. 3). The length of a pulse 18 is equal to the delay in the command and address signal network. Connected to output 18 of the exclusive-OR gate 16 is an integrator, which comprises a resistor 17 and a capacitor 21, and delivers to circuit point 20 a voltage level 20' that corresponds to the length of pulse 18 (cf. last row in FIG. 3). Voltage 20' at point 20 is applied to an inverting input on a differential amplifier 22, whose noninverting input has a reference voltage indicating a nominal delay applied to it. The reference voltage, which is applied to connection 4 of delay detector circuit 6, is preferably derived from the supply voltage for exclusive-OR gate 16, for example, by a voltage divider.

An output signal 23 from differential amplifier 22 (acting as a comparator) is supplied to control inputs on delay circuits 71 and 72, for the purpose of setting their delay time. If, by way of example, the relation 1 V per 1 ns delay time ($\Delta t_{var}$) in delay circuits 71 and 72 holds true, a control voltage of 1.25 V at input 4 of the delay detector circuit 6, gives a delay time of 1.25 ns from buffer input 2, to the input of memory chips 13, for all command and address signals. If, as mentioned, the voltage at input 4 of delay detector circuit 6 is derived from the supply voltage for exclusive-OR gate 16, the delay which is set on delay circuits 71 and 72 is not dependent on the supply voltage. A phase shift between inputs 14 and 15 to delay detector circuit 6 (as a percentage of the cycle time) is determined by the voltage on input 4 (percentage of the supply voltage). The set delay time cannot be shorter than the maximum delay time in buffer amplifier architecture 1, for the case in which the delay time set on delay circuits 71 and 72 is at a minimum.

FIG. 4 shows another exemplary embodiment of the present invention, in which a buffer amplifier architecture 1' is used in a register architecture. The circuit architecture depicted in FIG. 4 differs from that in FIG. 1 merely by the addition of register 80, which is arranged between the output of first receiver elements 51 and the input of first delay circuits 71. Register 80 is clocked by the clock signal produced by receiver element 52 for the purpose of latching the command and address signals.

In an exemplary embodiments of the present invention, the buffer amplifier architecture depicted above can either constitute a separate integrated circuit chip on a printed circuit board, or can be integrated in another chip, for example an interface chip, on the printed circuit board.

Thus, as will be appreciated by those skilled in the art, an embodiment of the present invention provides an architecture, applicable to devices such as buffer amplifiers and registers, that contains an adjustable delay and a fixed-delay feedback loop, which electrically encompasses the same path as conventional command and address lines. This reduces the difference between a minimum and a maximum delay from a buffer amplifier architecture or a register architecture to memory chips, and renders the delay independent of the parameters of the printed circuit board in the semiconductor circuit module.

In accordance with a further aspect of the invention, the feedback loop has a reference line network having the same structure and the same electrical properties as capacitance elements that terminate the signal line network and the reference line network and have the same capacitances as the signal inputs on the chips on the semiconductor circuit module. Preferably, these capacitance elements are produced by dummy pins on the chips or by unused signal inputs on the same.

In the case of semiconductor memory modules, the signals buffered by the buffer amplifier architecture are preferably command and address signals. Preferably, the first set of receiver elements and the additional clock cycle receiver element all have respective differential amplifiers. Preferably, the first set of output buffer amplifiers and the second set of output buffer amplifier connected to the system clock receiver elements all have respective push-pull amplifiers.

The delay detector circuit preferably has an exclusive-OR gate, with the first and second inputs, and an R—C element, forming an integrator architecture at the output of the exclusive-OR gate, for the purpose of producing a voltage level that corresponds to the actual delay time, and which is supplied to an inverting input of the differential amplifier in the delay detector circuit. The reference signal applied to the third input of the delay detector circuit is preferably derived from the supply voltage for the exclusive-OR gate. In this way, the delay on the controlled delay line is independent of the supply voltage.

The buffer amplifier architecture either can be a separate integrated chip located on the printed circuit board in the semiconductor circuit module, or instead can be integrated in another chip on the semiconductor circuit module.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A buffer amplifier architecture for buffering signals that are supplied in parallel to substantially identical chips on a semiconductor circuit module, comprising:

first receiver elements for respective parallel reception of the signals;

first output buffer amplifiers, whose input is respectively connected to an output on a respective first receiver element, for receiving signals from the first receiver elements and producing buffered output signals that are supplied to the chips on the semiconductor circuit module via a signal line network; and first delay circuits with an adjustable delay time, $\Delta t_{var}$, which are respectively connected between the output of each first receiver element and the input of each first output buffer amplifier, and delay the signals received from the respective receiver element in accordance with a set delay time, $\Delta t_{var}$.

2. The buffer amplifier architecture of claim 1, further comprising:

a second set of receiver elements for receiving a system clock signal;

a second output buffer amplifiers, whose input is connected to an output on the second receiver element, for the purpose of producing a buffered output clock signal;

a second delay circuit with an adjustable delay time, $\Delta t_{var}$, which is provided between the output of the second receiver element and the input of the second output buffer amplifier for the purpose of delaying the output of the clock signal received from the second receiver element in accordance with the set delay time, $\Delta t_{var}$; and a delay detector circuit having a first and a second input, where the first input is connected to the output of the second receiver element and the second input is connected via a feedback loop to the output of the second output buffer amplifier, for the purpose of detecting an actual delay time between the clock signals applied to its first and second inputs.

3. The buffer amplifier architecture of claim 2, wherein the delay detector circuit further comprises:

a third input, to which a reference signal indicating a nominal delay is applied, and a differential amplifier arranged to produce a control voltage that corresponds to the difference between the detected actual delay time and the nominal delay time indicated by the reference signal, and which is respectively supplied to a control input on the first and second delay circuits for the purpose of setting the delay time, $t_{var}$.

4. The buffer amplifier architecture of claim 1, wherein the chips are DRAM chips, and wherein the semiconductor circuit module is a DRAM memory module.

5. The buffer amplifier architecture in claim 1, wherein the feedback loop includes a reference line network having the same structure and the same electrical properties as capacitance elements that terminate the signal line network and the reference line network, wherein the capacitance elements have the same capacitances as the signal inputs on the chips on the semiconductor circuit module.

6. The buffer amplifier architecture of claim 5, wherein the capacitance elements are produced by dummy pins on the chips.

7. The buffer amplifier architecture of claim 5, wherein the capacitance elements are produced by unused signal inputs on the chips.

8. The buffer amplifier architecture of claim 1, wherein the signals buffered by the buffer amplifier architecture are command and address signals for memory chips.

9. The buffer amplifier architecture of claim 1, wherein the first set of receiver elements and the second set of receiver elements each include differential amplifiers.

10. The buffer amplifier architecture of claim 1, wherein the first set and second set of output buffer amplifiers each include respective push-pull amplifiers.

11. The buffer amplifier architecture of claim 1, wherein the delay detector circuit further comprises:

an exclusive-OR gate connected to the first and second inputs; and an R—C element connected to the output of the exclusive-OR gate, wherein the delay detector circuit produces a voltage level that corresponds to the actual delay time, wherein the voltage level is supplied to an inverting input of the differential amplifier in the delay detector circuit.

12. The buffer amplifier architecture of claim 9, wherein the reference signal applied to the third input is derived from the supply voltage for the exclusive-OR gate.

13. The buffer amplifier architecture in claim 1, wherein the buffer amplifier arrangement is implemented in the form of a separate integrated circuit chip.

14. The buffer amplifier architecture in claim 1, wherein the buffer amplifier architecture is integrated in another chip on the semiconductor circuit module.

15. The buffer amplifier architecture in claim 14, wherein the buffer amplifier architecture is implemented on a DRAM memory module.

* * * * *